(12) United States Patent
Krishnan et al.

(10) Patent No.: US 6,613,643 B1
(45) Date of Patent: Sep. 2, 2003

(54) STRUCTURE, AND A METHOD OF REALIZING, FOR EFFICIENT HEAT REMOVAL ON SOI

(75) Inventors: Srinath Krishnan, San Jose, CA (US); Matthew S. Buynoski, Palo Alto, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/155,044

(22) Filed: May 24, 2002

Related U.S. Application Data

(62) Division of application No. 09/493,397, filed on Jan. 28, 2000, now abandoned.

(51) Int. Cl.[7] .......................... H01L 21/76; H01L 21/30
(52) U.S. Cl. .................. 438/406; 438/455; 438/459
(58) Field of Search ........................ 438/406, 407, 438/455, 459

(56) References Cited

U.S. PATENT DOCUMENTS

| | | | |
|---|---|---|---|
| 4,975,126 A | 12/1990 | Margail et al. | 145/33.2 |
| 5,091,330 A * | 2/1992 | Cambou et al. | 438/406 |
| 5,234,535 A | 8/1993 | Beyer et al. | 156/630 |
| 5,238,865 A * | 8/1993 | Eguchi | 438/406 |
| 5,308,594 A | 5/1994 | Chen | 117/222 |
| 5,437,762 A | 8/1995 | Ochiai et al. | 216/20 |
| 5,459,104 A * | 10/1995 | Sakai | 438/406 |
| 5,463,241 A | 10/1995 | Kubo | 257/376 |
| 5,488,004 A | 1/1996 | Yang | 437/35 |
| 5,567,629 A | 10/1996 | Kubo | 437/24 |
| 5,665,613 A | 9/1997 | Nakashima et al. | 438/151 |
| 5,707,899 A | 1/1998 | Cerofolini et al. | 438/407 |
| 5,741,717 A | 4/1998 | Nakai et al. | 437/24 |
| 5,759,907 A | 6/1998 | Assaderaghi et al. | 438/386 |
| 5,770,881 A | 6/1998 | Pelella et al. | 257/347 |
| 5,780,900 A | 7/1998 | Suzuki et al. | 257/335 |
| 5,855,693 A | 1/1999 | Murari et al. | 148/33.3 |
| 5,891,265 A | 4/1999 | Nakai et al. | 148/33.3 |
| 5,918,136 A | 6/1999 | Nakashima et al. | 438/404 |
| 6,010,950 A * | 1/2000 | Okumura et al. | 438/455 |
| 6,096,582 A | 8/2000 | Inoue et al. | 438/118 |
| 6,180,487 B1 | 1/2001 | Lin | 438/407 |
| 6,242,320 B1 * | 6/2001 | So | 438/406 |
| 2001/0007367 A1 * | 7/2001 | Ohkubo | 257/347 |

* cited by examiner

*Primary Examiner*—Amir Zarabian
*Assistant Examiner*—Toniae M. Thomas
(74) *Attorney, Agent, or Firm*—Amin & Turocy, LLP

(57) ABSTRACT

In one embodiment, the present invention relates to a method of forming a silicon-on-insulator substrate, involving the steps of providing a first silicon substrate and a second silicon substrate; surface modifying at least one of the first silicon substrate and the second silicon substrate by forming a pattern thereon; forming a first insulation layer over the first silicon substrate to provide a first structure and a second insulation layer over the second silicon substrate to provide a second structure; bonding the first structure and the second structure together so that the first insulation layer is adjacent the second insulation layer; and removing a portion of the first or second silicon substrate thereby providing the silicon-on-insulator substrate.

13 Claims, 3 Drawing Sheets

STRUCTURE, AND A METHOD OF REALIZING, FOR EFFICIENT HEAT REMOVAL ON SOI

RELATED APPLICATIONS

This application is a Divisional application of application Ser. No. 09/493,397 filed on Jan. 28, 2000, now abandoned.

TECHNICAL FIELD

The present invention generally relates to improved Silicon-on-Insulator structures. More particularly, the present invention relates to methods for removing heat from Silicon-on-Insulator devices and devices having such characteristics.

BACKGROUND ART

Silicon-on-Insulator (SOI) technology is of growing importance in the field of integrated circuits. SOI technology involves forming transistors in a relatively thin layer of semiconductor material overlying a layer of insulating material. More particularly, SOI technology is characterized by the formation of a thin silicon layer (device region) for formation of the active devices over an insulating layer, such as an oxide, which is in turn formed over a substrate. Transistor sources and drains are formed, for example, by implantations into the silicon layer while transistor gates are formed by forming a patterned oxide and conductor layer structure.

Such structures provide a significant gain in performance by having lower parasitic capacitance (due to the insulator layer) and increased drain current due to floating body charging effects (since no connection is made to the channel region and charging of the floating body provides access towards a majority of carriers which dynamically lower the threshold voltage, resulting in increased drain current). Devices, such as metal oxide silicon field effect transistors (MOSFET), have a number of advantages when formed on SOI wafers versus bulk silicon MOS transistors. These advantages include: reduced source/drain capacitance and hence improved speed performance at higher-operating frequencies; reduced $N^+$ to $P^+$ spacing and hence higher packing density due to ease of isolation; absence of latch-up; lower voltage applications; and higher "soft error" upset immunity (i.e., the immunity to the effects of alpha particle strikes).

Although there are significant advantages associated with SOI technology, there are significant disadvantages as well. For example, poor heat removal from devices on an SOI substrate is a significant disadvantage. Electrical devices generate heat, and the inability to remove or dissipate the heat results in poor and/or inconsistent performance of the electrical devices, or even in some instances device and/or substrate degradation.

There is poor heat removal for devices on SOI substrates primarily because of the oxide insulation layer. More specifically, the oxide insulation layer has a markedly lower thermal conductivity than the thermal conductivity of conventional bulk silicon (typically used as semiconductor substrates), which typically surrounds semiconductor devices. For example, the thermal conductivity of silicon dioxide is about 1.4 W/m°C. while the thermal conductivity of conventional bulk silicon is about 150 W/m°C. As a result, the buried oxide layer undesirably insulates thermally the device region in SOI substrates.

In view of the aforementioned disadvantages, there is a need for SOI devices of improved quality, particularly SOI devices having improved heat removal characteristics, and more efficient methods of making such SOI devices.

SUMMARY OF THE INVENTION

As a result of the present invention, an SOI substrate having improved heat removal characteristics (from the device layer) is provided. By forming an SOI substrate according to the present invention, improved performance of devices subsequently formed on the SOI substrate is facilitated. Moreover, forming an SOI substrate in accordance with the present invention does not degrade or deleteriously effect the advantageous properties and characteristics commonly associated with SOI technology (improved speed performance at higher-operating frequencies, higher packing density, absence of latch-up, lower voltage applications, and higher "soft error" upset immunity).

In one embodiment, the present invention relates to a method of forming a silicon-on-insulator substrate, involving the steps of providing a first silicon substrate and a second silicon substrate; surface modifying at least one of the first silicon substrate and the second silicon substrate by forming a pattern thereon; forming a first insulation layer over the first silicon substrate to provide a first structure and a second insulation layer over the second silicon substrate to provide a second structure; bonding the first structure and the second structure together so that the first insulation layer is adjacent the second insulation layer; and removing a portion of the first or second silicon substrate thereby providing the silicon-on-insulator substrate.

In another embodiment, the present invention relates to a method of facilitating heat removal from a device layer of a silicon-on-insulator substrate formed by a bond and etch-back process, the silicon-on-insulator substrate comprising bulk silicon, a buried insulation layer over the bulk silicon, and a silicon device layer over the insulation layer, involving the step of removing from about 500 Å to about 4,000 Å in thickness of silicon from a portion of the bulk silicon thereby forming a patterned surface in the bulk silicon, the patterned surface in the bulk silicon adjacent the buried insulation layer.

In yet another embodiment, the present invention relates to a silicon-on-insulator substrate, containing a silicon substrate layer having a patterned top surface; an insulation layer over the patterned top surface of the silicon substrate layer, the insulation layer having a first thickness over patterned portions of the silicon substrate layer and a second thickness over unpatterned portions of the silicon substrate layer; and a silicon device layer comprising silicon over the insulation layer.

DISCLOSURE OF INVENTION

Figure 1:
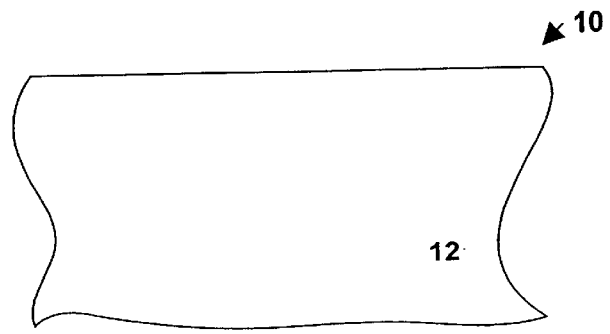
FIG. 1 is a cross-sectional view of a first structure used to make an SOI substrate according to one embodiment of the present invention.

By forming an SOI substrate having improved heat removal characteristics, the performance of devices subsequently formed on the SOI substrate can be substantially improved. While not wishing to be bound to any theory, it is believed that by forming a modified silicon layer according to the present invention, it is consequently possible to increase the amount of heat that may be dissipated (and/or increase the rate at which heat may be removed) from the device layer of the SOI substrate by dissipating the heat through the thinner portions of the buried insulation layer. Improving the removal of heat from the device layer consequently improves the performance and increases the life of devices, such as MOSFETs, formed on the device layer of the SOI substrate.

The present invention involves selectively thinning the buried insulation layer by modifying the top surface of the bulk silicon layer and/or the bottom surface of the silicon device layer of an SOI substrate. In the completed SOI substrate, the selectively thinned portions of the buried insulation layer permit greater dissipation of heat compared to the relatively thick portions of the buried insulation layer. The relatively thin buried insulation layer is formed in areas where self heating is not desirable, such as in the active portions (for example, underneath heat generating devices), while the relatively thick buried insulation layer is formed in other areas of the SOI substrate, such as in the isolation or field portions. In particular, the present invention involves identifying regions or areas on a silicon substrate that will or that are likely to support structures that generate heat, and relatively thin buried insulation layer in these regions or areas. As a result of the methods of the present invention, there are relatively thick and relatively thin portions of the continuous buried insulation layer permitting increased heat dissipation in the areas associated with the relatively thin portions of the continuous buried insulation layer.

The present invention initially involves identifying regions or areas on a bulk or monocrystalline silicon substrate that, after all semiconductor processing is completed, are designated (or likely) to support structures that generate heat. Structures that generate heat include transistors, such as MOSFETs, conductive lines, and the like. These "hot" regions typically correspond to predetermined circuit patterns.

A suitable mask such as a photoresist is formed and patterned (deposited and developed) over the hot regions of one or both of the bulk silicon substrate and the silicon that corresponds to the subsequently formed silicon device layer. Alternatively, a suitable hardmask may be formed over the hot regions. The thickness and identity of the photoresist/hardmask is such that the photoresist/hardmask has the capability to facilitate patterning of one or both of the bulk silicon substrate and the silicon that corresponds to the subsequently formed silicon device layer. After the mask is patterned, portions of one or both of the bulk silicon substrate and the silicon that corresponds to the subsequently formed silicon device layer are exposed.

A portion of the silicon in the exposed portions of one or both of the bulk silicon substrate and the silicon that corresponds to the subsequently formed silicon device layer is removed in any suitable manner, such as wet or dry etching. In a preferred embodiment, the silicon is removed using anisotropic etching. When partially etching the exposed silicon, at least one or more halogen containing compounds, such as one of HBr, HCl, $Cl_2$, $NF_3$, $SF_6$, $CH_3F$, $C_4F_8$, $CF_4$ and $CHF_3$ is used as the etch plasma.

In one embodiment, the amount in thickness of the silicon removed in the exposed areas is from about 250 Å to about 5,000 Å. In another embodiment, the amount in thickness of the silicon removed in the exposed areas is from about 500 Å to about 4,000 Å. In another embodiment, the amount in thickness of the silicon removed in the exposed areas is from about 1,000 Å to about 3,000 Å. If still present, the patterned mask is removed. As a result, the surface of one or both of the bulk silicon substrate and the silicon that corresponds to the subsequently formed silicon device layer is modified in that there are relatively thick and thin portions.

An insulation layer is then formed over the surface modified silicon structure in any suitable manner, including wet and dry oxidation, and chemical vapor deposition (CVD) techniques, such as low pressure chemical vapor deposition (LPCVD) and plasma enhanced chemical vapor deposition (PECVD). Optionally, and typically preferably, the insulation layer is planarized (if it is not formed having at least a substantially planar top surface) in any suitable manner. In a preferred embodiment, the insulation layer is planarized using chemical mechanical polishing (CMP) techniques.

This structure containing the surface modified silicon is then bonded to a second structure containing an insulation layer on bulk silicon, for example, using bond and etch-back techniques. The second structure may or may not be similar to the first structure; that is, it may or may not contain surface modified silicon. The two structures are fused at the respective insulation layers, and the bulk silicon of the second structure is polished back to a desired thickness to form an SOI substrate. Polishing may involve CMP techniques. Fusing the two structures is conducted optionally under heat for a suitable period of time. For example, in one embodiment, the two structures are fused at a temperature from about 25° C. to about 1,000° C. for a time from about 20 minutes to about 6 hours. In another embodiment, the two structures are fused at a temperature from about 100° C. to about 600° C. for a time from about 40 minutes to about 4 hours. In yet another embodiment, the two structure are fused at a temperature from about 500° C. to about 550° C.

Alternatively, hydrogen is implanted in the bulk silicon near the bulk silicon/insulation layer interface of the second structure. As a result, microcracks are formed in a relatively thin portion of the bulk silicon adjacent the insulation layer. The two structures are fused at the respective insulation layers (under the conditions mentioned above), and a portion of the bulk silicon that does not contain the microcracks separates and is removed. Optionally, the remaining bulk silicon of second structure is polished back to a desired thickness and planarity to form an SOI substrate.

The two structures have insulation layers that have similar or different thicknesses. In one embodiment, the two structures have insulation layers that have similar thicknesses (a size within about 5% of each other). In another embodiment, the two structures have insulation layers that have different thicknesses (one thickness is at least about 50% greater in size than other, or one thickness is at least about 100% greater in size than other).

The SOI substrate formed in accordance with the present invention has a bulk or monocrystalline silicon layer, a buried insulation layer over the bulk silicon layer, and a silicon layer (device layer) over the buried insulation layer. The buried insulation layer typically contains silicon dioxide, although the insulation layer may contain any suitable insulating or oxide material. In one embodiment, the top surface of the bulk silicon layer (the surface adjacent the buried insulation layer) is modified, wherein the bulk silicon layer has relatively thick and thin portions. In another embodiment, the bottom surface of the silicon device layer (the surface adjacent the buried insulation layer) is modified, wherein the silicon device layer has relatively thick and thin portions. In yet another embodiment, both the top surface of the bulk silicon layer and the bottom surface of the silicon device layer are modified, wherein both the bulk silicon layer and the silicon device layer have relatively thick and thin portions.

The device layer has thickness from about 500 Å to about 5,000 Å (in embodiments where the bottom surface of the silicon device layer is modified, the average thickness is from about 500 Å to about 5,000 Å). In another embodiment, the device layer has thickness from about 1,000 Å to about 3,000 Å (in embodiments where the bottom surface of the silicon device layer is modified, the average thickness is from about 1,000 Å to about 3,000 Å).

Due to the surface modifications of one or both of the silicon layers, the buried insulation layer has relatively thick and thin portions. In one embodiment, the relatively thick portions of the buried insulation layer (generally corresponding to the areas directly above or below relatively thin portions of a silicon layer) have a thickness from about 500 Å to about 5,000 Å and the relatively thin portions of the buried insulation layer (generally corresponding to the areas directly above or below relatively thick portions of a silicon layer) have a thickness from about 100 Å to about 4,000 Å. In another embodiment, the relatively thick portions of the buried insulation layer have a thickness from about 750 Å to about 4,500 Å and the relatively thin portions of the buried insulation layer have a thickness from about 250 Å to about 3,500 Å. In yet another embodiment, the relatively thick portions of the buried insulation layer have a thickness from about 1,000 Å to about 4,000 Å and the relatively thin portions of the buried insulation layer have a thickness from about 500 Å to about 3,000 Å.

In one embodiment, the relatively thin portions of the buried insulation layer have a thickness that is from about 10% to about 90% smaller than the relatively thick portions. In another embodiment, the relatively thin portions of the buried insulation layer have a thickness that is from about 20% to about 80% smaller than the relatively thick portions. In yet another embodiment, the relatively thin portions of the buried insulation layer have a thickness that is from about 30% to about 70% smaller than the relatively thick portions.

Referring to FIGS. 1 to 7, a specific example of the present invention is described. Specifically referring to FIG. 1, a first structure 10 is provided. The first structure 10 is a bulk silicon substrate 12.

Figure 2:
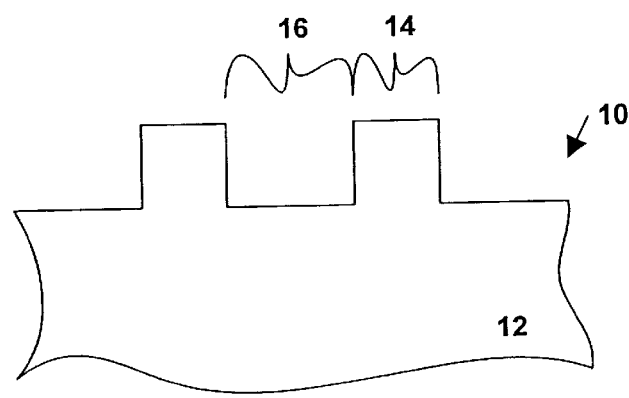
FIG. 2 is a cross-sectional view of another first structure used to make an SOI substrate according to one embodiment of the present invention.

Referring to FIG. 2, the top surface of the bulk silicon substrate 12 is patterned or modified using suitable lithography techniques. For example, a photoresist (not shown) is deposited over the bulk silicon substrate 12. The photoresist is patterned, exposing a portion of the top surface of the bulk silicon substrate 12. The bulk silicon substrate 12 is then partially etched wherein the thickness of the bulk silicon substrate 12 in the exposed areas is decreased. The exposed areas of the top surface of the bulk silicon substrate 12 are etched in an anisotropic manner with a fluorine containing compound. The patterned photoresist is then stripped or removed from the first structure 10.

The areas that are not etched 14 correspond to the area covered by the patterned photoresist mask. The areas that are etched 16 have a thickness that is smaller than the non-etched areas 14. In this embodiment, the difference in thickness between the areas that are etched 16 and not etched 14 is about 1,000 Å.

Figure 3:
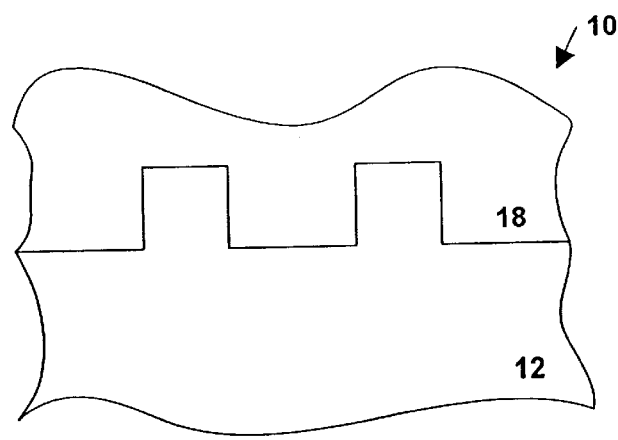
FIG. 3 is a cross-sectional view of yet another first structure used to make an SOI substrate according to one embodiment of the present invention.

Referring to FIG. 3, an insulation layer 18 containing silicon dioxide is formed over the top surface of the bulk silicon substrate 12 by CVD techniques. Either LPCVD or PECVD may be employed. In this embodiment, the insulation layer 18 is formed by PECVD using either silane and oxygen or silane and nitrous oxide.

Figure 4:
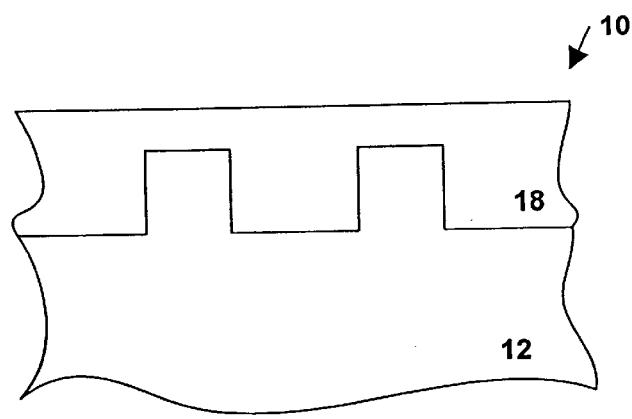
FIG. 4 is a cross-sectional view of still yet another first structure used to make an SOI substrate according to one embodiment of the present invention.

Referring to FIG. 4, insulation layer 18 containing silicon dioxide is planarized. In some instances, mainly due to the patterned bulk silicon substrate 12, the insulation layer 18 is formed in a non-planar configuration. The insulation layer 18 has a thickness of about 1,500 Å over the areas that are etched 16 and about 500 Å over the areas that are not etched 14.

Figure 5:
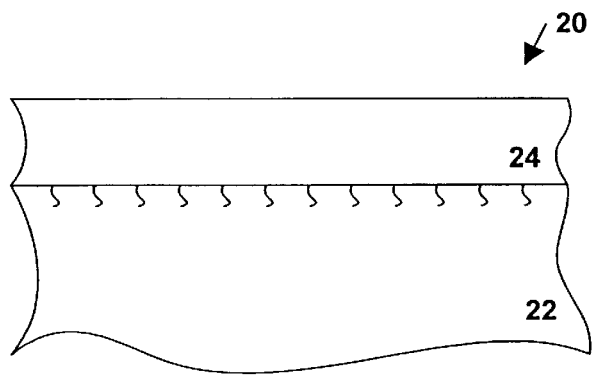
FIG. 5 is cross-sectional view of a second structure used to make an SOI substrate according to one embodiment of the present invention.

Referring to FIG. 5, a second structure 20 is provided. The second structure 20 contains a bulk silicon layer 22 and an insulation layer 24 thereover. In this embodiment, the insulation layer 24 contains silicon dioxide. Also in this embodiment, the thickness of the insulation layer 24 is about 1,000 Å. Hydrogen is then implanted in a portion of the bulk silicon layer 22 that is adjacent insulation layer 24. As a result, microcracks form in the bulk silicon layer 22 near the insulation layer 24.

Figure 6:
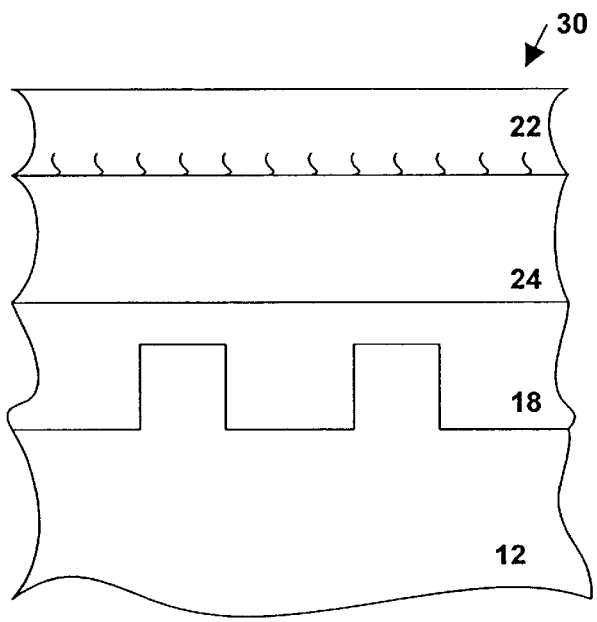
FIG. 6 is cross-sectional view of a bonded structure used to make an SOI substrate according to one embodiment of the present invention.

Referring to FIG. 6, the first structure 10 is bonded to the second structure 20 at the respective insulation layers 18 and 24. The respective insulation layers 18 and 24 are fused by application of heat for a sufficient period of time to bond the first and second structures 10 and 20. For example, the first and second structures 10 and 20 are held together for about 2 hours under a temperature of about 500° C.

Figure 7:
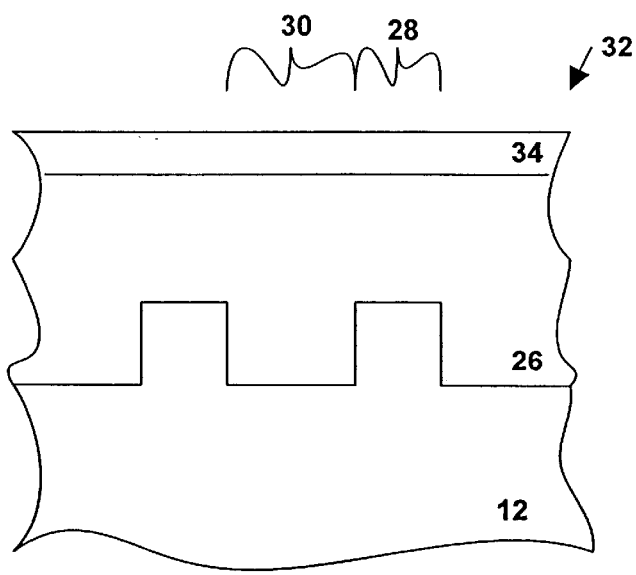
FIG. 7 is cross-sectional view of an SOI substrate according to one embodiment of the present invention.

Referring to FIG. 7, the portion of the bulk silicon layer 22 in FIGS. 5 and 6 or the second structure 20 above the microcracks is separated from the structure and is polished to a desired thickness to provide an SOI substrate 32 and specifically a device layer 34. Insulation layer 18 and 24 are fused during application of heat and/or pressure into one buried insulation layer 26. The SOI substrate 32 contains bulk silicon layer 12, buried insulation layer 26, and silicon device layer 34. The thickness of the device layer 24 is about 1,500 Å. The thickness of the insulation layer 26 (formerly the insulation layers 18 and 24) is about 1,500 Å in non-etched areas 28 and about 2,500 Å in the etched areas 30 (where the bulk silicon layer 12 was etched, see FIG. 2).

The SOI substrate 32 has improved heat removal properties due to the presence of the surface modified or patterned bulk silicon layer 12. In particular, the high thermal conductivity of bulk silicon (relative to silicon dioxide) removes heat that may locally accumulate in certain areas (typically near or under devices and/or conductive structures) of the device layer and insulation layer. In this connection, it is preferable to form at least some heat generating structures in non-etched areas 28 of the SOI substrate 32.

Figure 8:
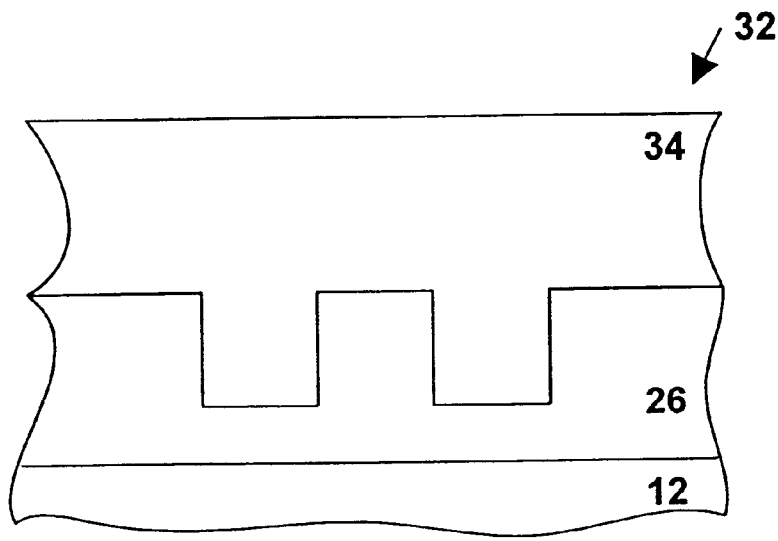
FIG. 8 is cross-sectional view of an SOI substrate according to another embodiment of the present invention.

Referring to FIG. 8, another embodiment of the present invention is shown. The SOI substrate 32 contains bulk silicon layer 12, buried insulation layer 26, and surface modified or patterned silicon device layer 34. However, in fabricating the SOI substrate 32 of FIG. 8, the first structure 10 of FIG. 4 is used to form the top portion (including the silicon device layer) while the second structure 20 of FIG. 5 is used to form the bottom portion. The SOI substrate 32 has improved heat removal properties due to the presence of the surface modified or patterned silicon device layer 34. In particular, the high thermal conductivity of bulk silicon (relative to silicon dioxide) and the relatively short distance between certain portions of the silicon device layer 34 and the bulk silicon layer 12 removes heat that may locally accumulate in certain areas (typically near or under devices and/or conductive structures) of the device layer and insulation layer.

Figure 9:
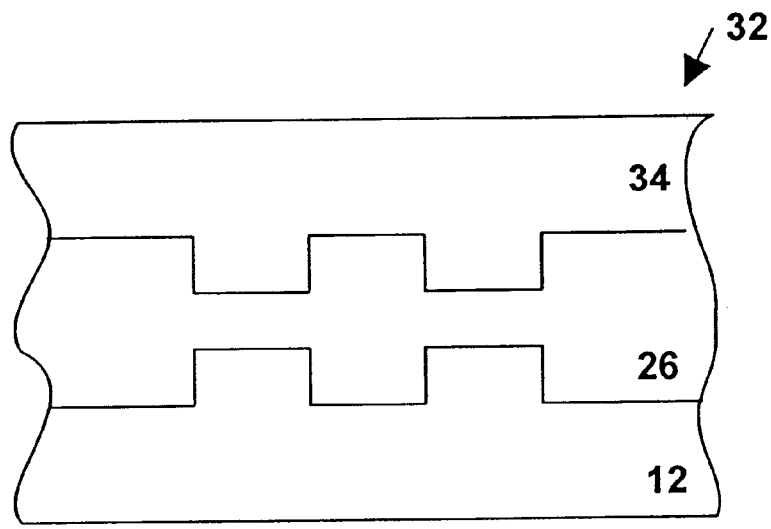
FIG. 9 is cross-sectional view of an SOI substrate according to yet another embodiment of the present invention.

Referring to FIG. 9, yet another embodiment of the present invention is shown. The SOI substrate 32 contains surface modified or patterned bulk silicon layer 12, buried insulation layer 26, and surface modified or patterned silicon device layer 34. In fabricating the SOI substrate 32 of FIG. 9, two structures similar to the first structure 10 of FIG. 4 are used (are fused together). The SOI substrate 32 has improved heat removal properties due to the presence of the surface modified bulk silicon layer 12 and the surface modified silicon device layer 34. In particular, the high thermal conductivity of bulk silicon (relative to silicon dioxide) and the relatively short distance between certain portions of the silicon device layer 34 and the bulk silicon layer 12 removes heat that may locally accumulate in certain areas (typically near or under devices and/or conductive structures) of the device layer and insulation layer. Moreover, the high thermal conductivity of bulk silicon (relative to silicon dioxide) removes heat that may locally accumulate in certain areas (typically near or under devices and/or conductive structures) of the device layer and insulation layer.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming a silicon-on-insulator substrate, comprising:

providing a first silicon substrate and a second silicon substrate;

surface modifying at least one of the first silicon substrate and the second silicon substrate by forming a pattern thereon;

forming a first insulation layer over the first silicon substrate to provide a first structure and a second insulation layer over the second silicon substrate to provide a second structure;

bonding the first structure and the second structure together so that the first insulation layer is adjacent the second insulation layer;

removing a portion of the first or second silicon substrate thereby providing the silicon-on-insulator substrate; and planarizing at least one of the first insulation layer and the second insulation layer using chemical mechanical polishing.

2. The method of claim 1, wherein the first insulation layer and the second insulation layer combine to form a buried insulation layer, the buried insulation layer including relatively thick portions having a thickness from about 500 Å to about 5,000 Å and relatively thin portions having a thickness from about 100 Å to about 4,000 Å.

3. The method of claim 1, wherein the pattern formed on at least one of the first silicon substrate and the second silicon substrate has features having a height from about 250 Å to about 5,000 Å.

4. The method of claim 1, wherein both the first silicon substrate and the second silicon substrate have a patterned surface.

5. The method of claim 1, wherein the first structure and the second structure are bonded together at a temperature from about 25° C. to about 1,000° C. for a time from about 20 minutes to about 6 hours.

6. The method of claim 1, wherein the silicon-on-insulator substrate comprises the first silicon substrate having a patterned surface; a buried insulation layer comprising the first insulation layer and the second insulation layer over the patterned surface of the first silicon substrate; and a device layer comprising silicon.

7. A method of forming a silicon-on-insulator substrate, comprising:

providing a first silicon substrate and a second silicon substrate;

surface modifying the first silicon substrate and the second silicon substrate by forming a pattern thereon;

forming a first insulation layer over the patterned first silicon substrate to provide a first structure and a second insulation layer over the patterned second silicon substrate to provide a second structure;

bonding the first structure and the second structure together so that the first insulation layer is adjacent the second insulation layer; and removing a portion of the first silicon substrate from the first structure or a portion of the second silicon substrate from the second structure thereby providing the silicon-on-insulator substrate.

8. A method of forming a silicon-on-insulator substrate, comprising:

providing a first silicon substrate and a second silicon substrate;

surface modifying at least one of the first silicon substrate and the second silicon substrate by forming a pattern thereon;

forming a first insulation layer over the first silicon substrate to provide a first structure and a second insulation layer over the second silicon substrate to provide a second structure;

bonding the first structure and the second structure together so that the first insulation layer is adjacent the second insulation layer; and removing a portion of the first or second silicon substrate thereby providing the silicon-on-insulator substrate, wherein the silicon-on-insulator substrate comprises the first silicon substrate having a patterned surface; a buried insulation layer comprising the first insulation layer and the second insulation layer over the patterned surface of the first silicon substrate; and a device layer comprising silicon.

9. The method of claim 8, wherein the first insulation layer and the second insulation layer combine to form a buried insulation layer, the buried insulation layer including relatively thick portions having a thickness from about 500 Å to about 5,000 Å and relatively thin portions having a thickness from about 100 Å to about 4,000 Å.

10. The method of claim 8, wherein the pattern formed on at least one of the first silicon substrate and the second silicon substrate has features having a height from about 250 Å to about 5,000 Å.

11. The method of claim 8, wherein both the first silicon substrate and the second silicon substrate have a patterned surface.

12. The method of claim 8 further comprising planarizing at least one of the first insulation layer and the second insulation layer using chemical mechanical polishing.

13. The method of claim 8, wherein the first structure and the second structure are bonded together at a temperature from about 25° C. to about 1,000° C. for a time from about 20 minutes to about 6 hours.

* * * * *